United States Patent
Seo

(10) Patent No.: US 6,737,292 B2
(45) Date of Patent: May 18, 2004

(54) METHOD OF FABRICATING AN IMAGE SENSOR MODULE AT THE WAFER LEVEL AND MOUNTING ON CIRCUIT BOARD

(75) Inventor: Tae Jun Seo, Suwon-shi (KR)

(73) Assignee: Samsung Electro-Mechanics Co., Ltd., Kyungki-Do (KR)

(*) Notice: Subject to any disclaimer, the term of this patent is extended or adjusted under 35 U.S.C. 154(b) by 0 days.

(21) Appl. No.: 10/330,646

(22) Filed: Dec. 27, 2002

(65) Prior Publication Data

US 2003/0218251 A1 Nov. 27, 2003

(30) Foreign Application Priority Data

May 27, 2002 (KR) ........................................ 2002-29331

(51) Int. Cl.$^7$ .............................................. H01L 21/58
(52) U.S. Cl. ........................... 438/64; 438/68; 438/113; 438/119
(58) Field of Search .............................. 438/57, 64, 66, 438/68, 113, 119, 126, 458, 116

(56) References Cited

U.S. PATENT DOCUMENTS 6,169,319 B1 * 1/2001 Malinovich et al. ........ 257/447
6,503,780 B1 * 1/2003 Glenn et al. ................. 438/116
6,534,340 B1 * 3/2003 Karpman et al. ............ 438/113
2002/0019069 A1 * 2/2002 Wada .......................... 438/69
2002/0096731 A1 * 7/2002 Wu et al. .................... 257/434
2002/0171031 A1 * 11/2002 Kim et al. ................ 250/208.1

FOREIGN PATENT DOCUMENTS

JP  2001-068654       3/2001   ........... H01L/27/14
JP  2002043451 A  *  2/2002   ........... H01L/23/02

* cited by examiner

Primary Examiner—Carl Whitehead, Jr.
Assistant Examiner—Stephen W. Smoot
(74) Attorney, Agent, or Firm—Darby & Darby

(57) ABSTRACT

Disclosed is an image sensor module applied to a thin image sensor device. A method of fabricating the image sensor module consists of the steps of forming a bump on a glass, attaching the glass to an image sensor at a wafer level, and firstly and secondly dicing the resulting structure. Therefore, the present invention is advantageous in that fabrication of an inferior image sensor module is reduced, thus improving a quality of the image sensor module, productivity of the image sensor module is improved because the image sensor module is fabricated at the wafer level, and a gold wiper process is omitted, thus reducing fabrication costs of the image sensor module.

12 Claims, 9 Drawing Sheets second dicing width first dicing width second dicing width second dicing width

METHOD OF FABRICATING AN IMAGE SENSOR MODULE AT THE WAFER LEVEL AND MOUNTING ON CIRCUIT BOARD

BACKGROUND OF THE INVENTION

1. Field of the Invention

The present invention relates to an image sensor module applied to a thin image sensor device. More particularly, the present invention provides an image sensor module and a method of fabricating the same, comprising the steps of forming a bump on a glass, attaching the glass to an image sensor at a wafer level, and firstly and secondly dicing the resulting structure, and so fabrication of an inferior image sensor module is reduced, thus improving the quality of the image sensor module, productivity of the image sensor module is improved because the image sensor module is fabricated at the wafer level, and a gold wiper process is omitted in order to reduce fabrication costs of the image sensor module.

2. Description of the Prior Art

As is well known to those skilled in the art, recently, digital cameras have been widely used for internet images and communication. Particularly, demands for a small-sized camera module have increased according to widespread use of a next-generation mobile telecommunication terminal for PDA (Personal Digital Assistant) and IMT-2000 (International Mobile Telecommunication-2000). For example, a compact mobile telecommunication terminal is being increasingly applied to internet audiovisual communication. In other words, there is a great demand for slim camera modules used to produce the digital cameras with improved functions.

Particularly, it is expected that PDA terminals will be utilized as multimedia equipment using various peripheral devices such as a camera module and a mobile telecommunication module, as well as being used to check the daily schedule. Accordingly, it is necessary to provide telecommunication services capable of storing, transporting, and providing audio data, pictures, and moving pictures, and demands for compact slim camera modules will increase.

Therefore, in the case of an image sensor module using a CCD (charge coupled device) or CMOS (complementary metal oxide semiconductor) image sensor which is a basic component of the camera module, a CLCC (ceramic leadless chip carrier) or COB (chip on board) package having a hall is used to reduce the height of the module.

FIGS. 1 to 6 schematically illustrates fabrication of a conventional image sensor module. As in FIG. 1, a plurality of image sensor chips positioned on a wafer are divided into individual image sensor chips. At this time, an image region 52 for substantially perceiving an image exists in the image sensor chip 51.

With reference to FIG. 2, the individual image sensor chip 51 is subjected to a die-bonding to connect it to a circuit board 50. The resulting structure is then subjected to a wire-bonding using a wire 53 to electrically connect the image sensor chip to the circuit board, as shown in FIG. 3.

Referring to FIG. 4, a cover glass or an IR-filter 30 is adhered to a housing 10 by using a synthetic resin 40. The housing 10 is solidly adhered to the circuit board having the image sensor chip with the use of the synthetic resin 40, as shown in FIG. 5.

Turning now to FIG. 6, a holder 20 provided with a lens 21 is mounted or screwed onto an opening of the housing 10.

The resulting image sensor device module package is provided with the housing 10 having a space 11.

The holder 20 mounted on the opening of the housing 10 is provided with the lens 21 for precisely focusing the image.

An iris, that is to say, an IR filter 30 is adhered to the space 11 of the housing 10 with the use of a synthetic resin such as an epoxy resin 40, and an end of the housing is adhered to the ceramic circuit board 50 with the use of a synthetic resin 40.

The image sensor 51 is positioned on the circuit board 50.

At this time, the image sensor 51 is adhered to the circuit board by the die-bonding and wire-bonding processes.

This conventional image sensor module does not have any operational problems, but is disadvantageous in that it has a large volume due to the wire-bonding process, and so it is unsuitably applied to a compact machine.

Another disadvantage is that the conventional image sensor module is individually packaged, thereby reducing productivity of the image sensor module and increasing its fabrication cost.

With reference to FIG. 7, a solid image sensor device is suggested in order to avoid the above disadvantages of the conventional image sensor as shown in FIGS. 1 to 6, which is disclosed in Japanese Patent Publication No. Hei 2001-068654. According to this publication, the solid image sensor device is characterized in that a transparent substrate 101 is attached to a side of a FPCB 102 which has an opening, a solid image sensor device 104 is then attached to another side of the FPCB 102 so as to face an image sensor surface towards the opening in order to electrically connect to the FPCB 102 by a bump 103, and the above components are attached to each other by applying a sealing agent 105 to lateral sides of the solid image sensor device.

At this time, packaging of the solid image sensor device is conducted by attaching the FPCB to the solid image sensor device through a Au-bump, sealing lateral sides of the solid image sensor device with an adhesive agent, and attaching the FPCB to the transparent substrate having an electric circuit pattern on a surface thereof through use of a thermosetting sheet 106.

However, this patent is disadvantageous in that inferior products may be fabricated due to inferior particles and pixel damage because the bump is directly formed on a CMOS image sensor wafer, and productivity of the solid image sensor device is reduced because the packaging of the image sensor module is conducted with the use of individual chips.

SUMMARY OF THE INVENTION

Therefore, it is an object of the present invention to avoid the above disadvantages, and to provide an image sensor module which can be applied to a thin image sensor device. More particularly, the present invention provides an image sensor module and a method of fabricating the same, comprising the steps of forming a bump on a glass, attaching the glass to an image sensor at a wafer level, and firstly and secondly dicing the resulting structure, and so fabrication of an inferior image sensor module is reduced, thus improving a quality of the image sensor module, productivity of the image sensor module is improved because the image sensor module is fabricated at the wafer level, and a gold wiper process is omitted in order to reduce fabrication cost of the image sensor module.

The above objects of the present invention can be accomplished by providing an image sensor module connected to a flexible printed circuit board (flexible PCB), comprising the flexible printed circuit board of a perforation, positioned at a side portion thereof, and a conductive pattern for forwarding and transmitting an electric signal to a device connected to another side portion thereof; an image chip mounted on the perforation of the flexible printed circuit board; a transparent medium with a predetermined area wholly covering an upper side of the image chip; a bump, positioned on a side portion of the transparent medium, for securing an electric conductivity; an adhesive layer formed by layering the transparent medium having the bump positioned thereon with the image chip in such a way that the bump tightly is adhered to the pad; and an epoxy resin to mold a junction of a portion around the perforation of the flexible printed circuit board with a lower lateral portion of the image chip. The image chip has an image sensor positioned at the center thereof and a pad, positioned around the image sensor, connected to a metal pattern to allow for the flow of an electric signal.

The transparent medium consists of a glass or an IR filter, the bump consists of a medium with a high conductivity such as gold or lead, and the adhesive layer consists of an anisotropic conductive paste (ACP), an anisotropic conductive film (ACF), or a nonconductive paste (NCP).

Furthermore, the present invention provides a method of fabricating an image sensor module connected to a flexible printed circuit board, comprising the first step of forming image sensors and pads with predetermined patterns on a wafer in such a way that each image sensor is positioned at a regular interval and the pads are positioned along each outside edge of every image sensor; the second step of forming bumps with predetermined patterns at a side portion of a transparent medium having the same area as the wafer; the third step of forming an adhesive layer on the pads formed in the first step or on the bumps formed in the second step; the fourth step of oppositely adhering the bumps at a side portion of the transparent medium to the pads with the use of the adhesive layer formed in the third step; the fifth step of dicing the backside of the wafer in such a way that the wafer and the transparent medium, adhered to each other in the fourth step, layer each other; the sixth step of mounting a structure, consisting of the wafer and the transparent medium diced into a plurality of cells in the fifth step, in a perforation of a pattern part of the flexible printed circuit board, and molding a junction part of the flexible printed circuit board with a lower lateral portion of the wafer with the use of an epoxy resin.

At this time, the transparent medium consists of a glass or an IR filter, and the bump consists of a medium with high conductivity such as gold or lead.

Additionally, the adhesive layer consists of an anisotropic conductive paste (ACP), an anisotropic conductive film (ACF), or a nonconductive paste (NCP).

Furthermore, the fifth step comprises the steps of firstly dicing the backside of the wafer portion of the structure consisting of the wafer and the transparent medium while controlling a dicing width and depth so that the image sensor and the adhesive layer are not damaged; and secondly dicing the transparent medium at a width which is relatively more narrow than the used during the first dicing step.

In addition, the above object of the present invention can be accomplished by a provision of an image sensor module connected to a printed circuit board, comprising the printed circuit board having a perforation positioned at a side portion thereof and a conductive pattern for forwarding and transmitting an electric signal to a device connected to another side portion thereof; an image chip mounted on the perforation of the printed circuit board; a transparent medium with a predetermined area wholly covering an upper side of the image chip; a bump, positioned on a side portion of the transparent medium, for securing an electric conductivity; an adhesive layer formed by layering the transparent medium having the bump positioned thereon with the image chip in such a way that the bump tightly is adhered to the pad; and an epoxy resin molding a junction of a portion around the perforation of the printed circuit board with a lower lateral portion of the image chip. The image chip has an image sensor positioned at the center thereof and a pad, positioned around the image sensor, connected to a metal pattern for a flow of an electric signal.

The transparent medium consists of a glass or an IR filter, and the bump consists of a medium with high conductivity such as gold or lead.

Additionally, the adhesive layer consists of an anisotropic conductive paste (ACP), an anisotropic conductive film (ACF), or a nonconductive paste (NCP).

Furthermore, the above object of the present invention can be accomplished by a provision of a method of fabricating an image sensor module connected to a printed circuit board, comprising the first step of forming image sensors and pads with predetermined patterns on a wafer in such a way that each image sensor is positioned at a regular interval and the pads are positioned along each outside edge of every image sensor; the second step of forming bumps with predetermined patterns at a side portion of a transparent medium having the same area as the wafer; the third step of forming an adhesive layer on the pads formed in the first step or on the bumps formed in the second step; the fourth step of oppositely adhering the bumps on a side portion of the transparent medium to the pads with the use of the adhesive layer formed in the third step; the fifth step of dicing the backside of the wafer in such a way that the wafer and the transparent medium adhered to each other in the fourth step, layer each other; the sixth step of mounting a structure consisting of the wafer and the transparent medium, diced into a plurality of cells in the fifth step, in a perforation of a patterned part of the printed circuit board, and molding a junction part of the printed circuit board with a lower lateral portion of the wafer with the use of an epoxy resin.

The transparent medium consists of a glass or an IR filter, and the bump consists of a medium with high conductivity such as gold or lead.

The fifth step comprises the steps of firstly dicing the backside of the wafer portion of the structure consisting of the wafer and the transparent medium while controlling a dicing width and depth so that the image sensor and the adhesive layer are not damaged; and secondly dicing the transparent medium at a width which is relatively more narrow than the used during the first dicing step.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
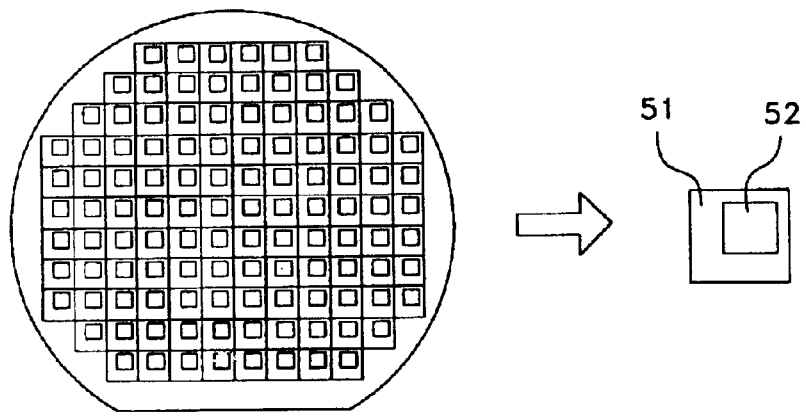
FIGS. 1 to 6 schematically illustrates fabrication of a conventional image sensor module.
Figure 2:
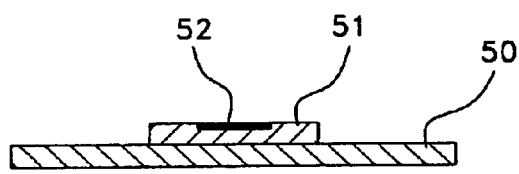
Figure 3:
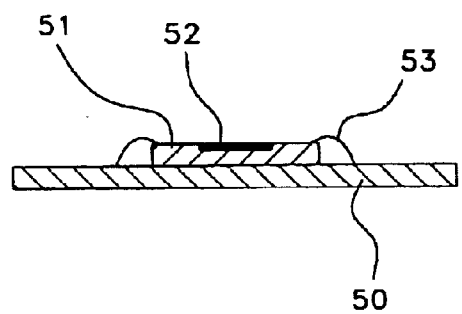
Figure 4:
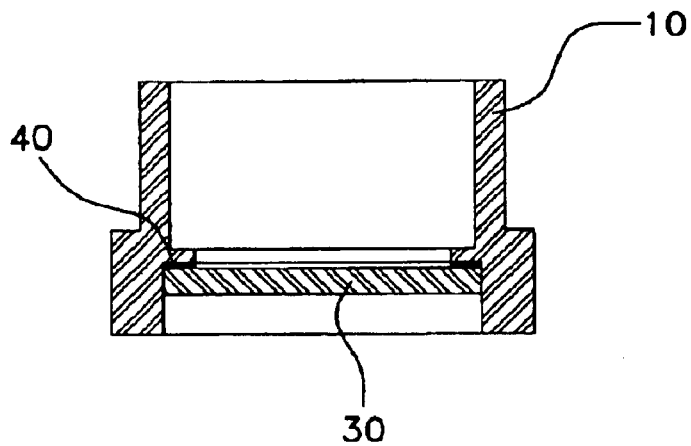
Figure 5:
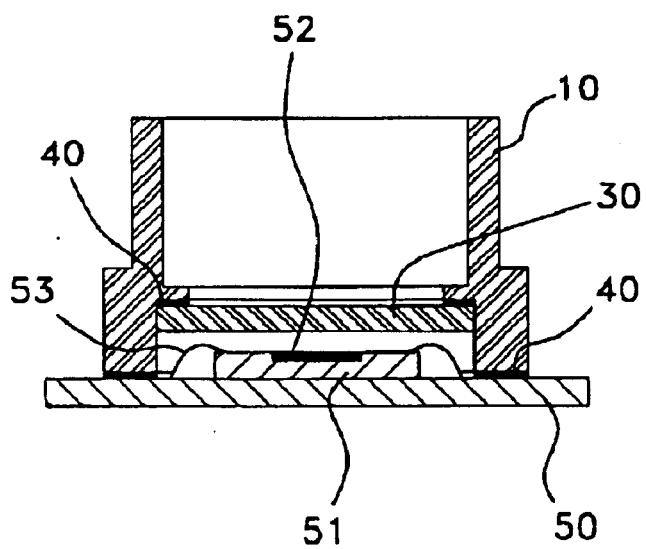
Figure 6:
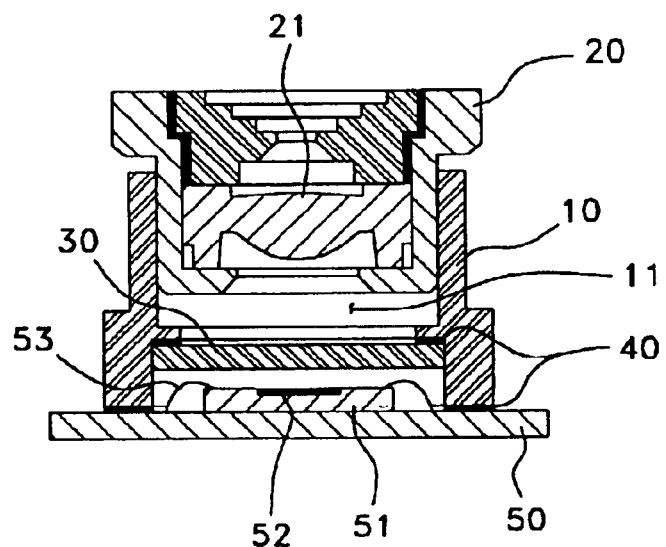
Figure 7:
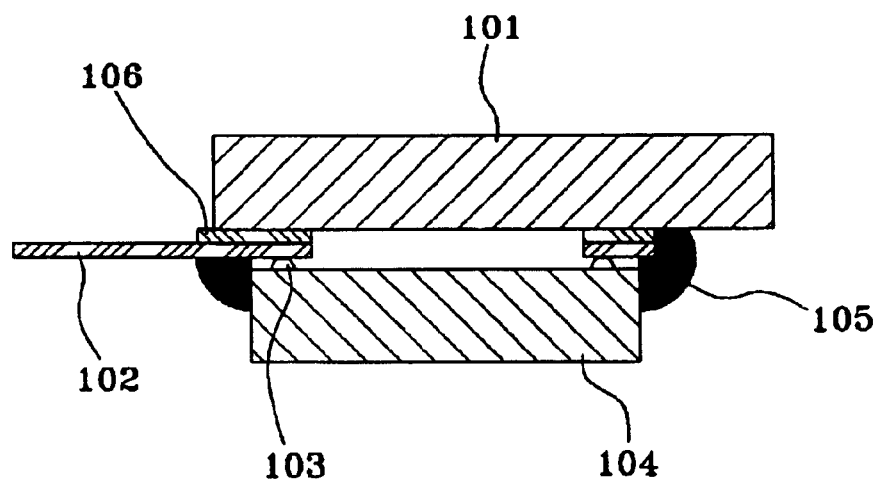
FIG. 7 is a sectional view of another conventional image sensor module.

Reference should now be made to the drawings, in which the same reference numerals are used throughout the different drawings to designate the same or similar components.

Figure 8:
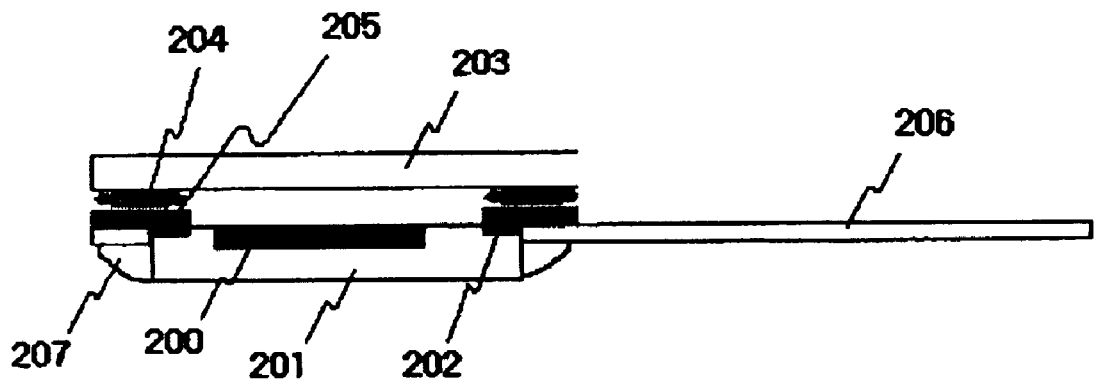
FIG. 8 is a sectional view of an image sensor module according to the present invention.
Figure 9:
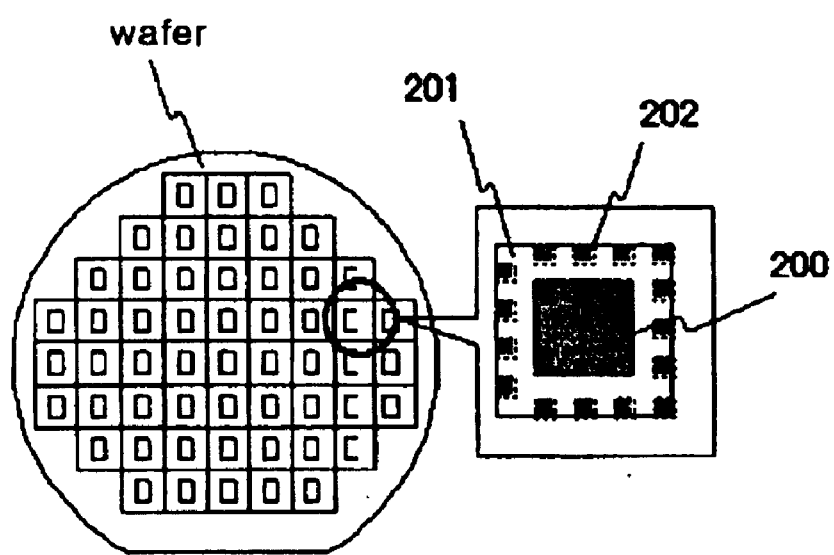
FIGS. 9 to 11 schematically illustrate fabrication of the image sensor module according to the present invention.
Figure 10:
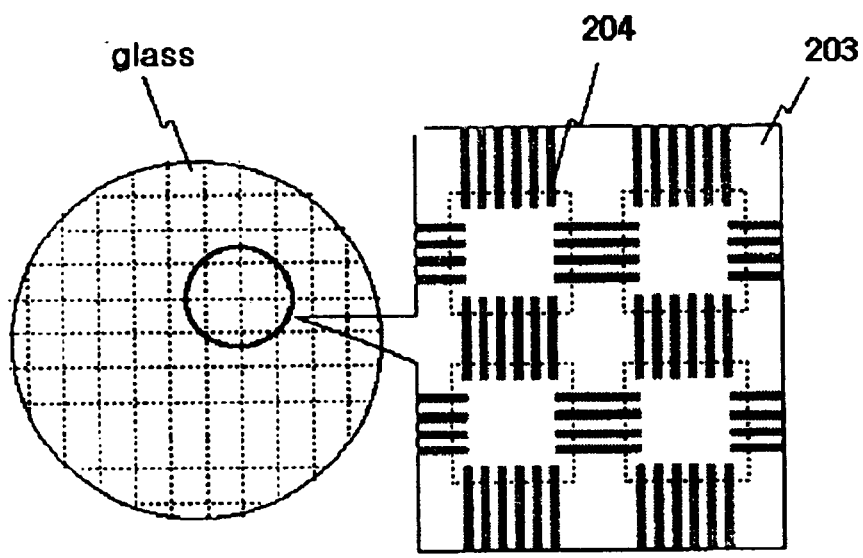
Figure 11:
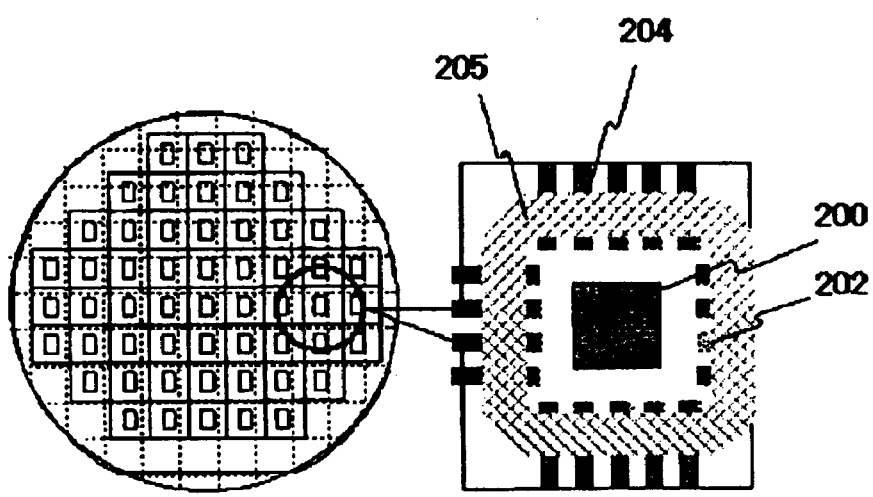

FIG. 8 is a sectional view of an image sensor module according to the present invention; and FIGS. 9 to 11 schematically illustrate fabrication of the image sensor module according to the present invention.

With reference to FIG. 8, an image sensor module connected to a flexible PCB comprises the flexible PCB 206 having a perforation positioned on a side portion thereof and a conductive pattern for forwarding and transmitting an electric signal to a device connected to another side portion thereof; an image chip 201 mounted on the perforation of the flexible PCB 206; a transparent medium 203 (a glass or an IR filter) with a predetermined area wholly covering an upper side of the image chip; a bump 204, positioned on an side portion of the transparent medium 203, for securing electric conductivity; an adhesive layer 205 (ACP, ACF, or NCP) formed by layering the transparent medium having the bump 204 positioned thereon with the image chip 201 in such a way that the bump 204 tightly is adhered to the pad; and an epoxy resin 207 to mold a junction of a portion around the perforation of the flexible PCB 206 with a lower lateral portion of the image chip. The image chip has an image sensor 200 positioned at the center thereof and a pad 202, positioned around the image sensor 200, connected to a metal pattern to allow for the flow of an electric signal.

Referring to FIGS. 9 to 11, fabrication of the image sensor module of the present invention is shown. As in FIG. 9, image sensors 200 are formed on a wafer in such a way that each image sensor 200 is positioned at a regular interval, and pads 202 with predetermined patterns are positioned around a circumference of the image sensor 200. At this time, the pad 202 is additionally formed during formation of the image sensor 200 on the wafer.

Turning now to FIG. 10, a bump 204 with a predetermined pattern is formed on a side portion of a glass 203 (or an IR filter) having nearly the same area and shape as the wafer. The bump 204 consists of a medium with high conductivity such as gold or lead.

Additionally, the wafer having the image sensor 200 and the pad 202 of FIG. 9 is oppositely adhered to the glass 203 having the bump 204 of FIG. 10 with the use of an adhesive agent 205 (ACP, ACF, or NCP), as shown in FIG. 11.

A structure consisting of the wafer and glass which are adhered to each other is subjected to a dicing process in order to be separated into a plurality of image chips.

The fabrication of the image sensor module of the present invention will be more minutely described with reference to the accompanying FIGS. 12 to 21.

Figure 12:
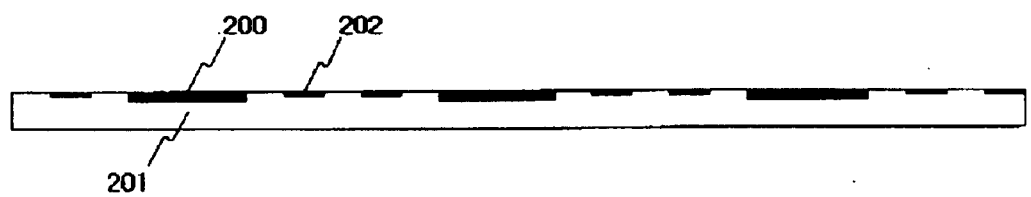
FIGS. 12 to 22 are sectional views stepwise illustrating fabrication of the image sensor module mounted on a flexible PCB according to the present invention.

Referring to FIG. 12, a side view of FIG. 9 is illustrated. Image sensors 200 are formed on a wafer in such a way that each image sensor 200 is positioned at a predetermined interval, and pads 202 with predetermined patterns are positioned along each outside edge of the image sensor 200.

Figure 13:

In addition to the wafer, a bump 204 with a predetermined pattern is separately formed on a side portion of a glass 203 (or an IR filter) having nearly the same area and shape as the wafer, as shown in FIG. 13. FIG. 13 is a side view of FIG. 10.

Figure 14:
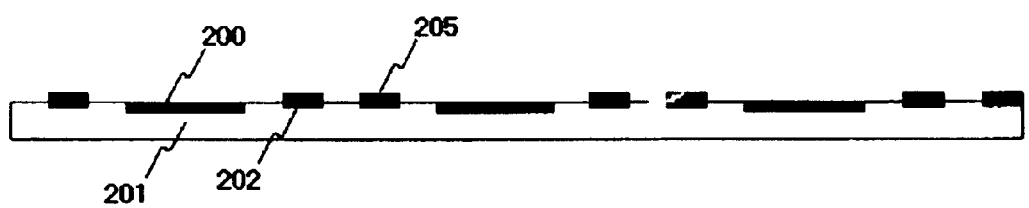
Figure 16:
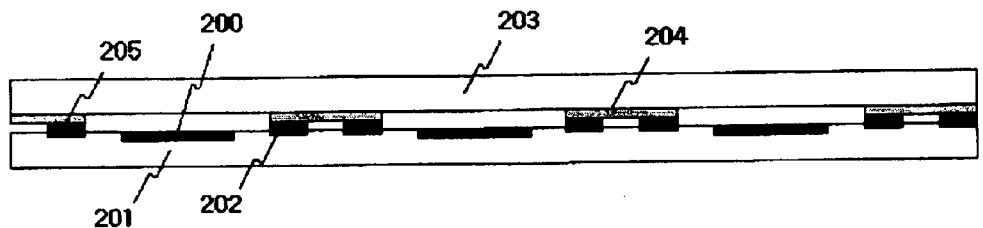

Turning to FIG. 14, an adhesive agent 205 (ACP, ACF, or NCP) is coated on the pad 202 of FIG. 12, and the wafer is adhered to the glass by the adhesive agent 205 as shown in FIG. 16.

Figure 15:
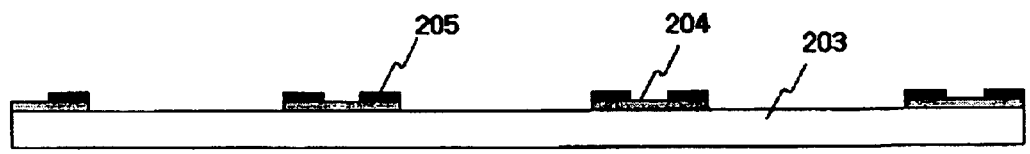

Alternatively, the adhesive agent is coated on the bump 204 of FIG. 13 as in FIG. 15, and the wafer is adhered to the glass by the adhesive agent as shown in FIG. 16.

In other words, the wafer 201 can be tightly adhered to the glass 203 with the use of the adhesive agent 205 in both the above cases.

Figure 17:
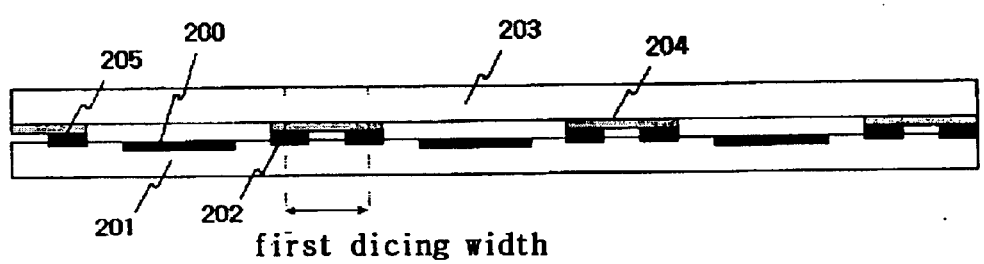
Figure 18:
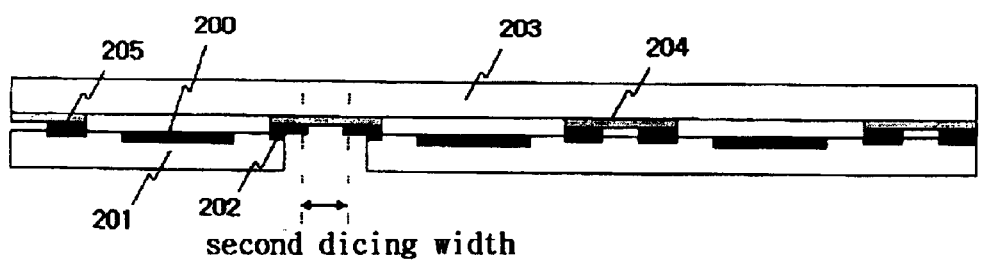
Figure 19:
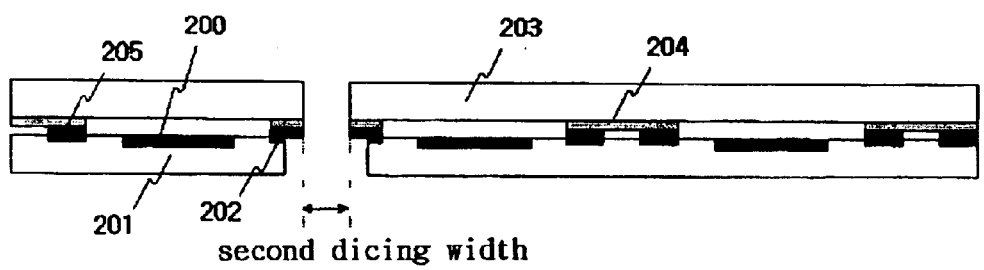

With reference to FIGS. 17 to 19, a structure consisting of the wafer and glass which are adhered to each other is subjected to a dicing process. The backside consists of the wafer portion of the structure consisting of the wafer 201 and the glass 203 and is firstly subjected to the dicing process while a dicing width and depth are controlled so that the image sensor and the adhesive agent 205 are not damaged, and the glass 203 is secondly subjected to the dicing process at a width which is relatively more narrow than the used during the first dicing step.

Figure 20:
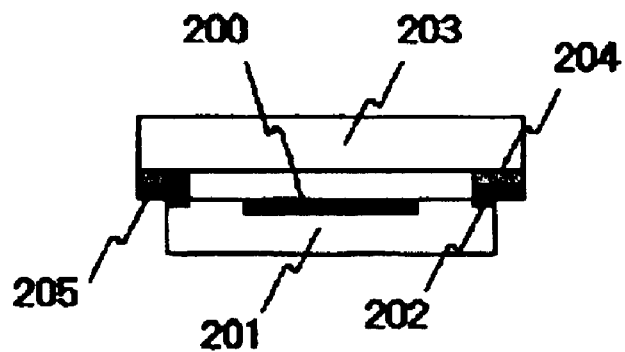

The resulting structure consisting of the wafer and glass, which is diced into a plurality of image chips, is illustrated in FIG. 20.

Figure 21:
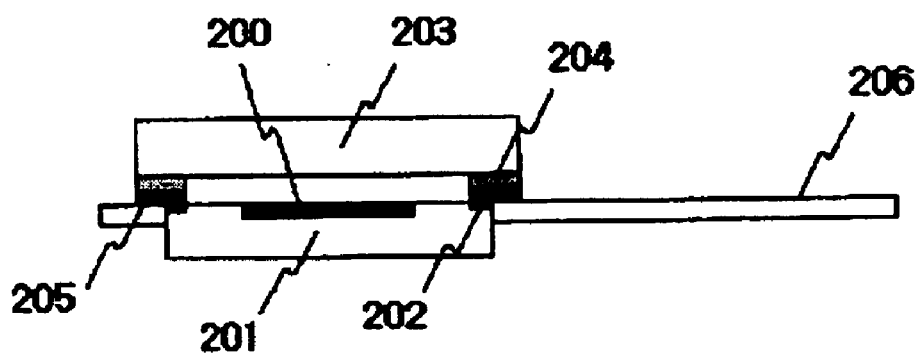

Turning now to FIG. 21, the image chip 201 is combined with a flexible PCB 206 with the use of the adhesive agent 204 in such a way that the structure of FIG. 20 is mounted in a perforation of the flexible PCB 206. The flexible PCB 206 has the perforation positioned on a side portion thereof as well as a conductive pattern for forwarding and transmitting an electric signal to a device connected to another side portion thereof.

At this time, the bump 204 positioned on the glass 203 constituting the structure of FIG. 20 is adhered to the conductive pattern of the flexible PCB 206 in such a way that the bump 204 oppositely corresponds to the conductive pattern.

Figure 22:
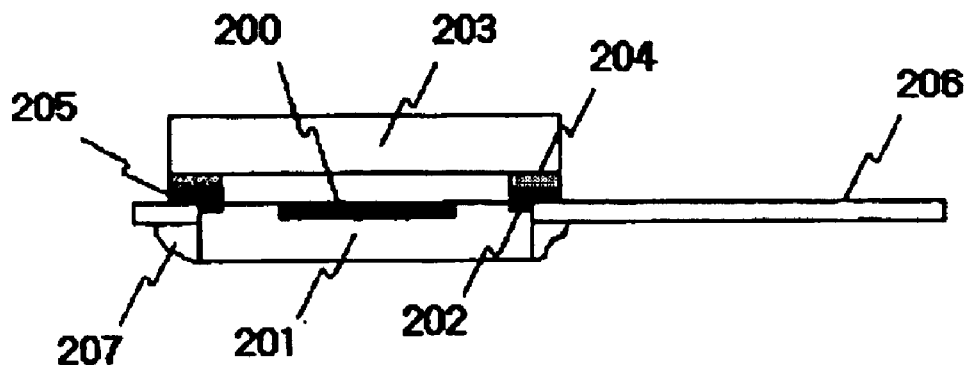

As in FIG. 22, a junction portion between the flexible PCB 206 and the backside of the image chip 201 is molded by use of an epoxy resin 207.

Figure 23:
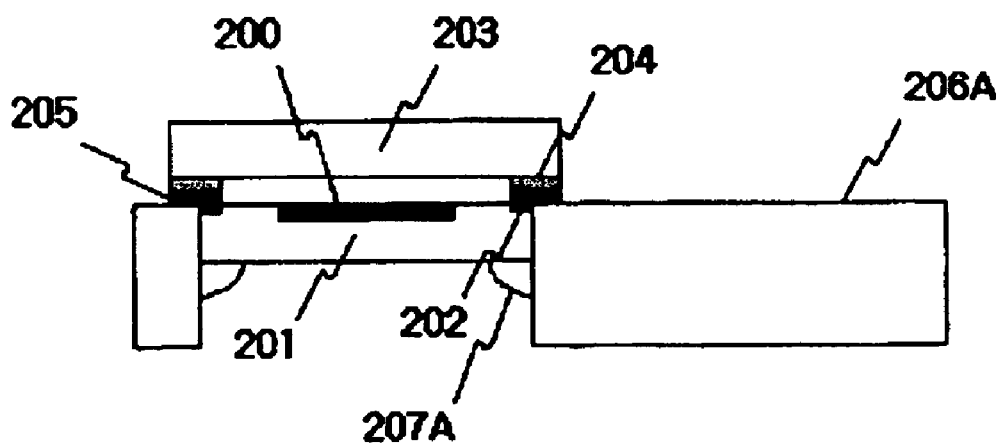
FIG. 23 is a sectional view of the image sensor module mounted on a PCB according to the present invention.

In FIG. 23, the structure of FIG. 20 mounted on a PCB 206A which is not flexible is illustrated.

As described above, the present invention provides an image sensor module and a method of fabricating the same, comprising the steps of forming a bump on a glass, attaching the glass to an image sensor at a wafer level, and firstly and secondly dicing the resulting structure. Therefore, the present invention is advantageous in that fabrication of an inferior image sensor module is reduced, thus improving a quality of the image sensor module, productivity of the image sensor module is improved because the image sensor module is fabricated at the wafer level, and a gold wiper process is omitted in order to reduce fabrication cost of the image sensor module.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of fabricating an image sensor module connected to a printed circuit board, comprising the steps of:
   a. forming image sensors and pads with predetermined patterns on a wafer in such a way that the image sensors are positioned at a regular interval and the pads are positioned along a peripheral edge of the image sensors;
   b. forming bumps with a pattern corresponding to the predetermined patterns on a face of a transparent medium having substantially the same area as the wafer;
   c. forming an adhesive layer on the pads formed in step a. or on the bumps formed in step b.;
   d. adhering the bumps, in opposed relationship to the pads with the use of the adhesive layer formed in step c.;
   e. dicing the backside of the wafer in such a way that the wafer and the transparent medium, which are adhered to each other in step d., layer each other;
   f. mounting a structure comprising the wafer and the transparent medium diced into a cells in step e. in a perforation of a pattern part of the printed circuit board, and molding a junction part of the printed circuit board with a lower lateral portion of the wafer with the use of an epoxy resin.

2. The method according to claim 1, wherein the transparent medium is a glass or IR filter.

3. The method according to claim 1, wherein the bump comprises a medium with high conductivity, including gold or lead.

4. The method according to claim 1, wherein the adhesive layer is a conductive adhesive agent including an anisotropic conductive paste (ACP) or an anisotropic conductive film (ACF).

5. The method according to claim 1, wherein the adhesive layer comprises a nonconductive adhesive agent including a nonconductive paste (NCP)

6. The method according to claim 1, wherein e. comprises the steps of:
   g. dicing the backside of the wafer portion of the structure consisting of the wafer and the transparent medium while controlling a dicing width and depth so that the image sensor and adhesive layer are not damaged; and
   h. dicing the transparent medium at a width which is relatively more narrow than that used during the first dicing step.

7. A method of fabricating an image sensor module connected to a flexible printed circuit board, comprising the steps of:
   a. forming image sensors and pads with predetermined patterns on a wafer in such a way that image sensors are positioned at a regular interval and the pads are positioned along a peripheral edge of the image sensors;
   b. forming bumps with a pattern corresponding to the predetermined patterns a face of a transparent medium having substantially the same area as the wafer;
   c. forming an adhesive layer on the pads formed in step a. or on the bumps formed in steps;
   d. adhering the bumps in opposed relationship to the pads with the use of the adhesive layer formed in step c.;
   e. dicing the backside of the wafer in such a way that the wafer and the transparent medium, which are adhered to each other in step d., layer each other;
   f. mounting a structure comprising the wafer and the transparent medium, diced into a cells in e., in a perforation of a pattern part of the flexible printed circuit board, and molding a junction part of the flexible printed circuit board with a lower lateral portion of the wafer with the use of an epoxy resin.

8. The method according to claim 7, wherein the transparent medium is a glass or an IR filter.

9. The method according to claim 7, wherein the bump comprises a medium with high conductivity, including gold or lead.

10. The method according to claims wherein the adhesive layer is a conductive adhesive agent including an anisotropic conductive paste (ACP) or an anisotropic conductive film (ACF).

11. The method according to claim 7, wherein the adhesive layer is a nonconductive adhesive agent including a nonconductive paste (NCP).

12. The method according to claim 7, wherein step e. comprises the steps of:
   g. dicing the backside of the wafer portion of the structure comprising the wafer and the transparent medium while controlling a dicing width and depth so that the image sensor and adhesive layer are not damaged; and
   h. dicing the transparent medium at a width which is relatively more narrow than that used during the step e.

* * * * *